United States Patent [19]
Meguriya et al.

[11] Patent Number: 5,977,216
[45] Date of Patent: Nov. 2, 1999

[54] SILICONE RUBBER COMPOSITIONS FOR HIGH-VOLTAGE ELECTRICAL INSULATORS AND POLYMERIC BUSHINGS

[75] Inventors: Noriyuki Meguriya; Susumu Sekiguchi; Syuuichi Azechi; Takeo Yoshida, all of Gunma-ken, Japan

[73] Assignee: Shin-Etsu Chemical Co., Ltd., Japan

[21] Appl. No.: 09/156,046

[22] Filed: Sep. 17, 1998

[30] Foreign Application Priority Data

Sep. 18, 1997 [JP] Japan .................................. 9-271999
Jul. 6, 1998 [JP] Japan .................................. 10-205897

[51] Int. Cl.$^6$ .................................................. H01L 21/00
[52] U.S. Cl. .......................................... 523/437; 523/437
[58] Field of Search .............................................. 524/437

[56] References Cited

U.S. PATENT DOCUMENTS

| | | | |
|---|---|---|---|
| 3,511,698 | 5/1970 | Talcott | ................................. 117/138.8 |
| 3,965,065 | 6/1976 | Elliott . | |
| 4,476,155 | 10/1984 | Niemi | ......................................... 427/58 |
| 5,405,896 | 4/1995 | Fujiki et al. | ............................. 524/265 |
| 5,519,080 | 5/1996 | Matsushita et al. | .................... 524/437 |
| 5,691,407 | 11/1997 | Azechi et al. | ......................... 524/437 |
| 5,824,729 | 10/1998 | Matsushita et al. | .................... 524/437 |

FOREIGN PATENT DOCUMENTS 0 808 868  5/1997  European Pat. Off. .

*Primary Examiner*—Edward J. Cain
*Attorney, Agent, or Firm*—Millen, White, Zelano, & Branigan, P.C.

[57] ABSTRACT

A silicone rubber composition is obtained by blending (A) 100 parts by weight of an organopolysiloxane composition of the organic peroxide or addition reaction curing type, with (B) 30–400 parts by weight of aluminum hydroxide which has been surface treated so as to bear $1.0 \times 10^{-6}$ to $2.0 \times 10^{-4}$ mol/gram of vinyl groups. The composition does not lose rubber strength even though it is loaded with large amounts of aluminum hydroxide. It cures into a silicone rubber having satisfactory physical properties and improved high-voltage electrical insulating properties and thus suited for use as high-voltage electrical insulators.

20 Claims, No Drawings

SILICONE RUBBER COMPOSITIONS FOR HIGH-VOLTAGE ELECTRICAL INSULATORS AND POLYMERIC BUSHINGS

BACKGROUND OF THE INVENTION

1. Field of the Invention

This invention relates to a silicone rubber composition which on heat curing provides silicone rubber serving as high-voltage electrical insulators. It also relates to polymeric bushings.

2. Prior Art

In general, high-voltage electrical insulating materials for use as insulators and bushings for power transmission lines are of porcelain or glass. Since these insulators are heavy and liable to breakage due to a lack of impact resistance, they require careful handling and impose a burden to workers. In a pollutive environment as in seaside areas and industrial areas, there is a tendency that dust, salts and mist attach to the surface of high-voltage electrical insulators, causing leakage currents and dry band discharge leading to flashover failure.

In order to eliminate the drawbacks of porcelain and glass insulators, a number of proposals have been made. For example, U.S. Pat. No. 3,511,698 discloses a weathering resistant high-voltage electrical insulator comprising a member of a thermosetting resin and a platinum catalyst-containing organopolysiloxane elastomer. JP-A 198604/1984 corresponding to U.S. Pat. No. 4,476,155 proposes a one-part room temperature curable organopolysiloxane composition which is applied to the outer surface of an electrical insulator of glass or porcelain so that the electrical insulator may maintain its high insulating properties even in the presence of moisture, air pollution, ultraviolet radiation and other outdoor stresses.

JP-B 35982/1978 corresponding to U.S. Pat. No. 3,965,065 discloses that a silicone rubber composition with improved electrical insulation is obtained by heating a mixture of an organopolysiloxane capable of heat curing into silicone rubber and aluminum hydroxide at temperatures above 100° C. for more than 30 minutes. JP-A 57574/1995 corresponding to U.S. Pat. No. 5,519,080 describes that the blending of a methylalkylsiloxane fluid in silicone rubber is effective for providing contact angle recovery with time and preventing flashover failure.

However, the silicone rubber materials used in the prior art techniques mentioned above are not yet fully satisfactory in high-voltage electrical insulation. They must be loaded with large amounts of aluminum hydroxide in order to improve the electrical insulation. This raises a new problem that since aluminum hydroxide itself is not effective for reinforcing silicone rubber, the blending of aluminum hydroxide increases the modulus of elasticity, but forms brittle rubber having little strength.

SUMMARY OF THE INVENTION

Therefore, an object of the present invention is to provide a novel and improved silicone rubber composition for use as high-voltage electrical insulators which cures into a silicone rubber having strength even when it is loaded with large amounts of aluminum hydroxide.

Another object of the present invention is to provide a novel and improved polymeric bushing having the silicone rubber composition applied and cured to a plastic core.

The invention pertains to a silicone rubber composition for use as a high-voltage electrical insulator comprising an organopolysiloxane composition of the organic peroxide or addition reaction curing type and aluminum hydroxide. We have found that the electrical insulating properties such as arc resistance and tracking resistance of the silicone rubber composition are improved when there is blended aluminum hydroxide which has been surface treated with suitable agents, for example, vinylsilazanes (e.g., tetramethyldivinyldisilazane, hexamethyldivinyltrisilazane, and cyclic vinylmethylsilazane) and vinylalkoxysilanes (e.g., vinyltrimethoxysilane, divinyldimethoxysilane and vinyltriethoxysilane) so that $1.0\times10^{-6}$ to $2.0\times10^{-4}$ mol of vinyl groups are available per gram of the aluminum hydroxide. Since the surface treated aluminum hydroxide is also effective for reinforcing silicone rubber, the high loading of the treated aluminum hydroxide is successful in imparting high-voltage electrical insulation at no sacrifice of rubber strength.

In a first aspect, there is provided a silicone rubber composition for use as a high-voltage electrical insulator comprising (A) 100 parts by weight of an organopolysiloxane composition of the organic peroxide or addition reaction curing type, and (B) 30 to about 400 parts by weight of aluminum hydroxide which has been surface treated so as to bear $1.0\times10^{-6}$ to $2.0\times10^{-4}$ mol/gram of vinyl groups.

In a second aspect, there is provided a high-voltage electrical insulator or polymeric bushing in the form of a solid bushing or tubular bushing which has been prepared by applying the silicone rubber composition to an outer periphery of a plastic core, followed by curing.

DETAILED DESCRIPTION OF THE INVENTION

In the silicone rubber composition according to the invention, a first component or component (A) is an organopolysiloxane composition of the organic peroxide or addition reaction curing type.

The organopolysiloxane composition of the organic peroxide curing type is preferably a silicone rubber composition comprising as main components, (a) an organopolysiloxane having on the average at least two alkenyl groups in a molecule of the following average compositional formula (1):

$$R^1_a SiO_{(4-a)/2} \tag{1}$$

wherein $R^1$ is a substituted or unsubstituted monovalent hydrocarbon group, 0.01 to 10 mol % of the $R^1$ groups being alkenyl, at least 90 mol % of a the $R^1$ groups being methyl, and letter a is a positive number of 1.9 to 2.4, and (b) an organic peroxide.

The alkenyl-bearing organopolysiloxane as component (a) is first described. In formula (1), $R^1$ is a substituted or unsubstituted monovalent hydrocarbon group, preferably having 1 to 12 carbon atoms, more preferably 1 to 8 carbon atoms. Examples include alkyl groups such as methyl, ethyl, propyl, isopropyl, butyl, isobutyl, tert-butyl, pentyl, neopentyl, hexyl, 2-ethylhexyl, heptyl, octyl, nonyl, decyl and dodecyl; cycloalkyl groups such as cyclopentyl, cyclohexyl and cycloheptyl; alkenyl groups such as vinyl, allyl, propenyl, isopropenyl, butenyl, isobutenyl, hexenyl and cyclohexenyl; aryl groups such as phenyl, tolyl, xylyl, biphenyl and naphthyl; aralkyl groups such as benzyl, phenylethyl, phenylpropyl and methylbenzyl; and substituted ones of these hydrocarbon groups wherein some or all of the hydrogen atoms are replaced by halogen atoms (e.g., F, Cl and Br) or cyano groups, typically halo- and cyano-substituted alkyl groups such as chloromethyl, 2-bromoethyl, 3,3,3-trifluoropropyl, 3-chloropropyl and cyanoethyl.

In formula (1), 0.01 to 10 mol %, preferably 0.02 to 2 mol % of the $R^1$ groups are alkenyl. The organopolysiloxane should have on the average at least two alkenyl groups in a molecule. The alkenyl groups may be attached to a silicon atom at an end of the molecular chain and/or a silicon atom intermediate of the molecular chain. From the standpoint of physical properties of cured rubber, the organopolysiloxane should preferably have at least alkenyl groups attached to the silicon atoms at both ends of the molecular chain. At least 90 mol %, namely 90 to 99.99 mol %, preferably 95 to 99.99 mol % of the $R^1$ groups are methyl. A methyl content of less than 90 mol % would adversely affect electrical properties and weather resistance. An alkenyl content below the above-defined range would adversely affect the physical properties as rubber material such as tensile strength, tear strength, elongation and hardness whereas a rubber composition with too much alkenyl content would become too hard, losing elasticity or becoming brittle. In formula (1), letter a is a positive number in the range of 1.9 to 2.4, especially 1.98 to 2.05.

The organopolysiloxane of formula (1) may have a linear molecular structure, a cyclic structure or a branched molecular structure containing $R^1SiO_{3/2}$ or $SiO_{4/2}$ units. Most often, it is a linear diorganopolysiloxane consisting essentially of recurring diorganosiloxane units represented by $R^1_2SiO_{2/2}$ and blocked with a triorganosiloxy unit represented by $R_{13}SiO_{1/2}$ at each end of a molecular chain. Basically, the substituents on silicon atoms (i.e. monovalent groups $R^1$) may be any of the aforementioned groups although it is preferred to introduce vinyl groups as the alkenyl group and methyl or phenyl groups as the other substituent.

The organopolysiloxane can be prepared by well-known methods, for example, by effecting equilibration reaction between an organocyclopolysiloxane and a hexaorgano-disiloxane in the presence of an alkali or acid catalyst.

Desirably the organopolysiloxane has an average degree of polymerization of at least 50, for example, 50 to 20,000, especially 100 to 8,000, and a viscosity of at least 100 centistokes (cs) at 25° C., for example, 100 to 10,000,000 cs at 25° C., especially 500 to 1,000,000 cs at 25° C.

The organic peroxide (b) is used as a catalyst for promoting crosslinking reaction of the organopolysiloxane (a). Any known organic peroxides are useful. Illustrative, non-limiting examples of the organic peroxide include benzoyl peroxide, 2,4-dichlorobenzoyl peroxide, p-methylbenzoyl peroxide, o-methylbenzoyl peroxide, 2,4-dicumyl peroxide, 2,5-dimethyl-bis(2,5-t-butylperoxy)hexane, di-t-butyl peroxide, t-butylperbenzoate, and 1,1-bis(t-butylperoxycarboxy)hexane.

The amount of the organic peroxide blended is a catalytic amount and may be properly determined in accordance with the desired curing rate. Usually, about 0.1 to about 10 parts, preferably about 0.2 to about 2 parts by weight of the organic peroxide (b) is blended per 100 parts by weight of the organopolysiloxane (a).

To adjust the fluidity and/or to improve the mechanical strength of molded parts, inorganic fillers may be blended with components (a) and (b) insofar as the benefits of the invention are not impaired. Such inorganic fillers include reinforcing fillers such as precipitated silica, fumed silica, fired silica and fumed titanium oxide; and non-reinforcing fillers such as ground quartz, diatomaceous earth, asbestos, aluminosilicate, iron oxide, zinc oxide, and calcium carbonate. The fillers may be used as such or after surface treatment with organic silicon compounds including organosilazanes, organochlorosilanes and organosiloxanes such as hexamethyldisilazane, octamethyltrisilazane, tetramethyldivinyldisilazane, trimethylchlorosilane, dimethyldichlorosilane, methyltrichlorosilane, and polydimethylsiloxane. If desired, pigments, heat resistance modifiers, flame retardants, and plasticizers may be blended although aluminum hydroxide is excluded.

The organopolysiloxane composition of the addition reaction curing type which is also used as component (A) is preferably one comprising as main components, (a) an organopolysiloxane having on the average at least two alkenyl groups in a molecule of the average compositional formula (1) defined above, (c) an organohydrogenpolysiloxane of the following average compositional formula (2):

$$R^2_bH_cSiO_{(4-b-c)/2} \qquad (2)$$

wherein $R^2$ is a substituted or unsubstituted monovalent hydrocarbon group, letter b is a positive number of 0.7 to 2.1, c is a positive number of 0.001 to 1.0, and the sum of b+c is from 0.8 to 3.0, the organohydrogenpolysiloxane having at least two hydrogen atoms each attached to a silicon atom in a molecule and being liquid at room temperature, and (d) an addition reaction catalyst. This organopolysiloxane composition of the addition reaction curing type is liquid or paste at room temperature, and cures into a rubbery elastomer when allowed to stand at room temperature or heated.

Component (a), alkenyl-containing organopolysiloxane of formula (1) is the same as the above-mentioned component (a) of the organopolysiloxane composition of the organic peroxide curing type.

With respect to the organohydrogenpolysiloxane of formula (2) as component (c), $R^2$ is a substituted or unsubstituted monovalent hydrocarbon group, examples of which are the same as previously mentioned for $R^1$. Preferably, the hydrocarbon group represented by $R^2$ is free of an aliphatic unsaturated bond, with methyl, phenyl and 3,3,3-trifluoropropyl groups being especially preferred. Letter b is a positive number of 0.7 to 2.1, preferably 0.9 to 2, c is a positive number of 0.001 to 1.0, preferably 0.01 to 1, and the sum of b+c is from 0.8 to 3.0, preferably 0.9 to 2.5.

The organohydrogenpolysiloxane acts as a crosslinking agent and contains at least two hydrogen atoms, preferably at least three hydrogen atoms, each attached to a silicon atom (namely SiH groups) in a molecule. The SiH groups may be positioned either at an end or intermediate of the molecular chain or both. The number of silicon atoms in a molecule is about 2 to about 500, preferably about 2 to about 150.

Examples of the organohydrogenpolysiloxane (c) include 1,1,3,3-tetramethyl-1,3-dihydrogendisiloxane, methylhydrogen cyclic polysiloxane, methylhydrogensiloxane-dimethylsiloxane cyclic copolymers, both end trimethylsiloxy-blocked methylhydrogenpolysiloxane, both end trimethylsiloxy-blocked dimethylsiloxane-methylhydrogensiloxane copolymers, both end dimethylhydrogensiloxy-blocked dimethylsiloxane, both end dimethylhydrogensiloxy-blocked dimethylsiloxane-methylhydrogensiloxane copolymers, both end trimethylsiloxy-blocked methylhydrogensiloxane-diphenylsiloxane copolymers, both end trimethylsiloxy-blocked methylhydrogensiloxane-diphenylsiloxane-dimethylsiloxane copolymers, both end dimethylhydrogensiloxy-blocked methylhydrogensiloxane-diphenylsiloxane-dimethylsiloxane copolymers, copolymers consisting of $(CH_3)_2HSiO_{1/2}$ units and $SiO_{4/2}$ units, copolymers consisting of $(CH_3)_2HSiO_{1/2}$ units, $(CH_3)_3SiO_{1/2}$ units, and $SiO_{4/2}$ units, and copolymers consisting of $(CH_3)_2HSiO_{1/2}$ units, $SiO_{4/2}$ units, and $(C_6H_5)SiO_{3/2}$ units.

Preferably, the organohydrogenpolysiloxane (c) is blended in an amount of about 0.1 to about 200 parts, more preferably about 0.3 to about 40 parts by weight per 100 parts by weight of the organopolysiloxane (a). Alternatively, the organohydrogenpolysiloxane may be blended in such amounts that about 0.5 to about 5 mol, preferably about 0.8 to about 2 mol of hydrogen atoms each attached to a silicon atom in its molecule (SiH groups) are available per mol of alkenyl groups in the organopolysiloxane (a).

The addition reaction catalyst (d) may be selected from platinum base catalysts such as platinum black, platinic chloride, chloroplatinic acid, reaction products of chloroplatinic acid with monohydric alcohols, complexes of chloroplatinic acid with olefins, and platinum bisacetoacetate, palladium base catalysts, and rhodium base catalysts. The amount of the addition reaction catalyst added is a catalytic amount and is usually from about 0.5 to 1,000 ppm, especially about 1 to 200 ppm of metallic platinum based on the organopolysiloxane (a).

To adjust the fluidity and/or to improve the mechanical strength of molded parts, inorganic fillers may be blended with components (a), (c) and (d) insofar as the benefits of the invention are not impaired. Such inorganic fillers include reinforcing fillers such as precipitated silica, fumed silica, fired silica and fumed titanium oxide; and non-reinforcing fillers such as ground quartz, diatomaceous earth, asbestos, aluminosilicate, iron oxide, zinc oxide, and calcium carbonate. The fillers may be used as such or after surface treatment with organic silicon compounds including organosilazanes, organochlorosilanes and organopolysiloxanes such as hexamethyldisilazane, octamethyltrisilazane, tetramethyldivinyldisilazane, trimethylchlorosilane, dimethyldichlorosilane, methyltrichlorosilane, and polydimethylsiloxane. If desired, pigments, heat resistance modifiers, flame retardants, and plasticizers may be blended although aluminum hydroxide is excluded.

Component (B) is vinyl-bearing aluminum hydroxide which is effective for improving the electrical insulating properties, typically arc resistance and tracking resistance, of silicone rubber and also for reinforcing silicone rubber. It is essential for the composition of the invention. The aluminum hydroxide used herein is generally represented by the formula: $Al_2O_3 \cdot 3H_2O$, or $Al(OH)_3$ and preferably in particulate form having a mean particle size of about 0.1 to 20 μm, especially about 0.5 to about 15 μm and a specific surface area of about 1.0 to 10 m$^2$/g as measured by a BET method. The mean particle size can be determined as a weight mean diameter or median diameter by a particle size distribution measuring device based on such a process as laser light diffraction process.

The amount of vinyl groups present on surfaces of aluminum hydroxide is $1.0 \times 10^{-6}$ to $2.0 \times 10^{-4}$ mol/gram, preferably $5.0 \times 10^{-6}$ to $10 \times 10^{-4}$ mol/gram. Outside this range, lower vinyl contents fails to impart a reinforcement effect whereas higher vinyl content offers too much crosslinking sites, failing to provide an elongation and a modulus of elasticity necessary as silicone rubber and resulting in a hard brittle rubber.

The vinyl-bearing aluminum hydroxide can be obtained by mixing or blending untreated aluminum hydroxide with a vinyl-bearing coupling agent such as a vinylsilane or vinylsilazane or a partial hydrolyzate thereof. Examples of the coupling agent include vinylsilazanes such as divinyltetramethyldisilazane, tetravinyldimethyldisilazane, hexamethyldivinyltrisilazane, and cyclic vinylmethylsilazane; vinylalkoxysilanes such as vinyltrimethoxysilane, vinyltriethoxysilane, divinyldimethoxysilane, divinyldiethoxysilane, vinylmethyldimethoxysilane, vinylmethyldiethoxysilane, and vinyltris(methoxyethoxy) silane; and vinylchlorosilanes such as vinyltrichlorosilane, divinyldichlorosilane and vinylmethyldichlorosilane. The vinyl groups may be chemically firmly attached to aluminum hydroxide as a result of reaction of aluminum hydroxide with the coupling agent or may be merely present on aluminum hydroxide by physical adsorption. An average distribution of vinyl groups on surfaces of aluminum hydroxide is typical. It is also acceptable to mix untreated aluminum hydroxide with treated aluminum hydroxide so that a necessary amount of vinyl groups may be available as a total.

Aluminum hydroxide is not only treated with the vinyl-bearing treating agent, but it may also be treated with the vinyl-bearing treating agent and a vinyl-free treating agent. Examples of the vinyl-free treating agent include organosilazanes such as hexamethyldisilazane, octamethyltrisilazane and diphenyltetramethyldisilazane, organoalkoxysilanes such as methyltrimethoxysilane, methyltriethoxysilane, ethyltrimethoxysilane, ethyltriethoxysilane, phenyltrimethoxysilane and dimethyldimethoxysilane, organochlorosilanes such as methyltrichlorosilane, dimethyldichlorosilane, trimethylchlorosilane and phenyltrichlorosilane, partial hydrolysates thereof, and mixtures thereof. It is also acceptable to mix aluminum hydroxide treated with the vinyl-bearing treating agent and aluminum hydroxide treated with the vinyl-free treating agent. When aluminum hydroxide is surface treated, the preferred degree of surface treatment is such that the amount of carbon attached thereto is 0.01 to 2% by weight, more preferably 0.02 to 1% by weight of the aluminum hydroxide. A degree of surface treatment in this range is effective for improving the compatibility of treated aluminum hydroxide with siloxanes and imparting a reinforcement effect to aluminum hydroxide.

Component (B) or aluminum hydroxide is blended in an amount of about 30 to about 400 parts, preferably about 50 to about 300 parts by weight per 100 parts by weight of the organopolysiloxane composition (A). On this basis, compositions containing less than 30 parts of component (B) cure into products which are less improved in tracking resistance and other electrical properties whereas compositions loaded with more than 400 parts of component (B) are difficult to blend and handle and would cure into hard brittle products.

The composition of the invention may be prepared in a conventional manner, and the molding and curing methods may employ well-known sets of molding and curing conditions corresponding to a particular curing type.

The silicone rubber composition for use as high-voltage electrical insulators according to the invention does not lose rubber strength even though it is loaded with large amounts of aluminum hydroxide. It cures into a silicone rubber having satisfactory physical properties and improved high-voltage electrical insulating properties.

In the second aspect, the silicone rubber composition is applied to an outer periphery of a plastic core and cured thereto. The plastic core is made of thermoplastic resins, typically glass fiber-reinforced plastics. There is obtained a high-voltage electrical insulator or polymeric bushing which may take the form of a solid bushing or hollow bushing.

EXAMPLE

Examples of the present invention are given below by way of illustration and not by way of limitation. All parts are by weight.

Example 1

A kneader/mixer was charged with 80 parts of a dimethylpolysiloxane blocked with a dimethylvinylsiloxy group at each end of its molecular chain having a viscosity of 10,000 cs at 25° C., 40 parts of fumed silica Aerosil 200 (Nippon Aerosil K.K.), 5 parts of hexamethyldisilazane, and 2 parts of water. The contents were agitated for one hour at room temperature (25° C.), the mixer was then heated to an internal temperature of 150° C., and agitation was continued for a further 3 hours, yielding a liquid silicone rubber base (a). To 40 parts of this liquid silicone rubber base (a) were added 60 parts of a dimethylpolysiloxane blocked with a dimethylvinylsiloxy group at each end of its molecular chain having a viscosity of 1,000 cs at 25° C. and 120 parts of aluminum hydroxide (b) having a vinyl content of $4.2 \times 10^{-5}$ mol/g, a carbon content of 0.12% by weight and a mean particle size of 1 μm. The mixture was mixed for 1 hour at room temperature. Thereafter, 2.5 parts of methylhydrogenpolysiloxane (c) shown below, 0.1 part of a 1% isopropyl alcohol solution of chloroplatinic acid, and 0.05 part of ethynyl cyclohexanol as a reaction controlling agent were added to the mixture, which was uniformly mixed at room temperature, yielding a silicone rubber composition.

Note that the aluminum hydroxide (b) was prepared by spraying 1 part of vinyltrimethoxysilane and 0.2 part of methyltrimethoxysilane to 100 parts of untreated aluminum hydroxide Higilite® H42-M having a mean particle size of 1 μm (Showa Denko K.K.), agitating the particles for 1 hour at room temperature, heating the particles, and effecting reaction at 100° C. for 1 hour.

Methylhydrogenpolysiloxane (c)

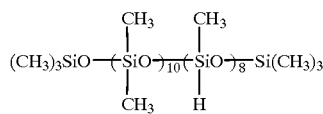

The silicone rubber composition was press molded at 150° C. for 10 minutes into rubber sheets of 6 mm and 2 mm thick. The sheet of 2 mm thick was measured for physical properties according to JIS K6301. The results are shown in Table 1. The sheet of 6 mm thick was subject to a tracking test and an erosion loss test, both described below. The results are shown in Table 2.

Tracking Test

The test was according to the standard ASTM D-2303-64T. To a test assembly with an electrode-to-electrode distance of 50 mm under an applied voltage of 4 kV, a foul solution (an aqueous solution containing 0.1% of $NH_4Cl$ and 0.02% of nonionic surfactant) was applied dropwise from the upper electrode at a rate of 0.6 ml/min. A time taken until a track was created to turn conductive was measured.

Erosion Weight Loss

An erosion weight loss (% by weight) which represents a degree of deterioration of rubber sheet by heat and spark during the tracking test was determined.

Erosion weight loss (wt %)=(weight loss by erosion)/(weight of sheet before test)×100%

Example 2

A kneader/mixer was charged with 80 parts of a dimethylpolysiloxane blocked with a trivinylsiloxy group at each end of its molecular chain having a viscosity of 10,000 cs at 25° C., 40 parts of fumed silica Aerosil 200 (Nippon Aerosil K.K.). 5 parts of hexamethyldisilazane, and 2 parts of water. The contents were agitated for one hour at room temperature (25° C.), the mixer was then heated to an internal temperature of 150° C., and agitation was continued for a further 3 hours, yielding a liquid silicone rubber base (d). To 40 parts of this liquid silicone rubber base (d) were added 60 parts of a dimethylpolysiloxane blocked with a trivinylsiloxy group at each end of its molecular chain having a viscosity of 1,000 cs at 25° C., 120 parts of the vinyl-bearing aluminum hydroxide (b) used in Example 1, and 0.7 part of t-butylperoxyisopropyl carbonate. The ingredients were mixed at room temperature until uniform, yielding a silicone rubber composition.

The silicone rubber composition was press molded at 170° C. for 10 minutes into rubber sheets of 6 mm and 2 mm thick, which were tested for physical properties, tracking resistance, and erosion loss as in Example 1. The results are shown in Tables 1 and 2.

Example 3

To 50 parts of the liquid silicone rubber base (a) used in Example 1 were added 50 parts of a dimethylpolysiloxane blocked with a dimethylvinylsiloxy group at each end of its molecular chain having a viscosity of 1,000 cs at 25° C., 60 parts of aluminum hydroxide (e) having a vinyl content of $2.5 \times 10^{-5}$ mol/g, a carbon content of 0.22% by weight and a mean particle size of 8 μm, 2.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The contents were mixed at room temperature until uniform, yielding a silicone rubber composition.

Note that the aluminum hydroxide (e) was prepared by spraying 0.8 part of vinyltrimethoxysilane and 1 part of ethyltrimethoxysilane to 100 parts of untreated aluminum hydroxide Higilite® H-32 having a mean particle size of 8 μm (Showa Denko K.K.), agitating the particles for 1 hour at room temperature, heating the particles, and effecting reaction at 100° C. for 1 hour.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Example 4

Compound (g) was prepared by blending 100 parts of rubbery diorganopolysiloxane (f) consisting of 99.825 mol % of dimethylsiloxane units, 0.15 mol % of methylvinylsiloxane units, and 0.025 mol % of dimethylvinylsiloxy units and having an average degree of polymerization of about 8,000 with 5 parts of a silanol end-blocked dimethylpolysiloxane (average degree of polymerization 10) as a dispersant, 25 parts of fumed silica having a specific surface area of 200 m²/g (Nippon Aerosil K.K.), and 160 parts of the vinyl-bearing aluminum hydroxide (b) used in Example 1.

To Compound (g) was added 1.0 part of a 40% paste of 2,5-dimethyl-bis(2,5-t-butylperoxy)hexane/the above-mentioned organopolysiloxane (a)/fumed silica having a specific surface area of 200 m²/g (Nippon Aerosil K.K.). The ingredients were uniformly dispersed in a twin roll mill. The silicone rubber composition was then press molded at 170° C. for 10 minutes into rubber sheets of 6 mm and 2 mm thick, which were tested for physical properties, tracking resistance, and erosion loss as in Example 1. The results are shown in Tables 1 and 2.

Example 5

Compound (i) was prepared by blending 100 parts of rubbery diorganopolysiloxane (f) consisting of 99.825 mol % of dimethylsiloxane units, 0.15 mol % of methylvinylsiloxane units, and 0.025 mol % of dimethylvinylsiloxy units and having an average degree of polymerization of about 8,000 with 5 parts of a silanol end-blocked dimethylpolysiloxane (average degree of polymerization 10) as a dispersant, 25 parts of fumed silica having a specific surface area of 200 m$^2$/g (Nippon Aerosil K.K.), and 160 parts of aluminum hydroxide (h) having a vinyl content of $6.2 \times 10^{-5}$ mol/g, a carbon content of 0.35% by weight and a mean particle size of 1 μm.

Note that the aluminum hydroxide (h) was prepared by spraying 2.5 parts of divinyltetramethyldisilazane to 100 parts of untreated aluminum hydroxide Higilite® H42-M having a mean particle size of 1 μm (Showa Denko K.K.), agitating the particles for 1 hour at room temperature, heating the particles, and effecting reaction at 100° C. for 1 hour.

To Compound (i) was added 1.0 part of a 40% paste of 2,5-dimethyl-bis(2,5-t-butylperoxy)hexane/the above-mentioned organopolysiloxane (a)/fumed silica having a specific surface area of 200 m$^2$/g (Nippon Aerosil K.K.). The ingredients were uniformly dispersed in a twin roll mill. The silicone rubber composition was then press molded at 170° C. for 10 minutes into rubber sheets of 6 mm and 2 mm thick, which were tested for physical properties, tracking resistance, and erosion loss as in Example 1. The results are shown in Tables 1 and 2.

Comparative Example 1

To 40 parts of the liquid silicone rubber base (a) used in Example 1 were added 60 parts of a dimethylpolysiloxane blocked with a dimethylvinylsiloxy group at each end of its molecular chain having a viscosity of 1,000 cs at 25° C., 120 parts of untreated aluminum hydroxide having a mean particle size of 1 μm (Higilite® H42-M, Showa Denko K.K.), 2.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The ingredients were uniformly mixed at room temperature, yielding a silicone rubber composition.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Comparative Example 2

To 40 parts of the liquid silicone rubber base (d) used in Example 2 were added 60 parts of a dimethylpolysiloxane blocked with a trivinylsiloxy group at each end of its molecular chain having a viscosity of 1,000 cs at 25° C., 120 parts of the untreated aluminum hydroxide Higilite® H-42M used in Comparative Example 1, and 0.7 part of t-butylperoxyisopropyl carbonate. The ingredients were mixed at room temperature until uniform, yielding a silicone rubber composition.

The silicone rubber composition was press molded at 170° C. for 10 minutes into rubber sheets of 6 mm and 2 mm thick, which were tested for physical properties, tracking resistance, and erosion loss as in Example 1. The results are shown in Tables 1 and 2.

Comparative Example 3

To 50 parts of the liquid silicone rubber base (a) used in Example 1 were added 60 parts of a dimethylpolysiloxane blocked with a dimethylvinylsiloxy group at each end of its molecular chain having a viscosity of 1,000 cs at 25° C., 60 parts of untreated aluminum hydroxide having a mean particle size of 8 μm (Higilite® H-32, Showa Denko K.K.), 2.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The ingredients were mixed at room temperature until uniform, yielding a silicone rubber composition.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Comparative Example 4

To 40 parts of the liquid silicone rubber base (a) used in Example 1 were added 60 parts of a dimethylpolysiloxane blocked with a dimethylvinylsiloxy group at each end of its molecular chain having a viscosity of 1,000 cs at 25° C., 20 parts of the treated aluminum hydroxide (b) used in Example 1, 2.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The ingredients were uniformly mixed at room temperature, yielding a silicone rubber composition.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Comparative Example 5

Compound (j) was prepared by blending 100 parts of rubbery diorganopolysiloxane (f) consisting of 99.825 mol % of dimethylsiloxane units, 0.15 mol % of methylvinylsiloxane units, and 0.025 mol % of dimethylvinylsiloxy units and having an average degree of polymerization of about 8,000 with 5 parts of a silanol end-blocked dimethylpolysiloxane (average degree of polymerization 10) as a dispersant, 25 parts of fumed silica having a specific surface area of 200 m$^2$/g (Nippon Aerosil K.K.), and 160 parts of the untreated aluminum hydroxide (Higilite® H-42M) used in Comparative Example 1.

To Compound (j) was added 1.0 part of a 40% paste of 2,5-dimethyl-bis(2,5-t-butylperoxy)hexane/the above-mentioned organopolysiloxane (a)/fumed silica having a specific surface area of 200 m$^2$/g (Nippon Aerosil K.K.). The ingredients were uniformly dispersed in a twin roll mill. The silicone rubber composition was then press molded at 170° C. for 10 minutes into rubber sheets of 6 mm and 2 mm thick, which were tested for physical properties, tracking resistance, and erosion loss as in Example 1. The results are shown in Tables 1 and 2.

Comparative Example 6

To 40 parts of the liquid silicone rubber base (a) used in Example 1 were added 60 parts of a dimethylpolysiloxane blocked with a dimethylvinylsiloxy group at each end of its molecular chain having a viscosity of 1,000 cs at 25° C., 120 parts of aluminum hydroxide (k) having a vinyl content of $4.5 \times 10^{-7}$ mol/g, a carbon content of 0.20% by weight and a mean particle size of 1 μm, 2.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The ingredients were uniformly mixed at room temperature, yielding a silicone rubber composition.

Note that the aluminum hydroxide (k) was prepared by spraying 0.04 part of vinyltrimethoxysilane and 0.2 part of methyltrimethoxysilane to 100 parts of untreated aluminum hydroxide Higilite® H42-M (Showa Denko K.K.), agitating the particles for 1 hour at room temperature, heating the particles, and effecting reaction at 100° C. for 1 hour.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Comparative Example 7

To 40 parts of the liquid silicone rubber base (a) used in Example 1 were added 60 parts of a dimethylpolysiloxane blocked with a dimethylvinylsiloxy group at each end of its molecular chain having a viscosity of 1,000 cs at 25° C., 120 parts of aluminum hydroxide (r) having a vinyl content of $4.4 \times 10^{-4}$ mol/g, a carbon content of 2.0% by weight and a mean particle size of 1 μm, 7.5 parts of methylhydrogenpolysiloxane (c) used in Example 1, 0.1 part of a 1% isopropyl alcohol solution of chloroplatinic acid, and 0.05 part of ethynyl cyclohexanol as a reaction controlling agent. The ingredients were uniformly mixed at room temperature, yielding a silicone rubber composition.

Note that the aluminum hydroxide (r) was prepared by spraying 15 parts of vinyltrimethoxysilane to 100 parts of untreated aluminum hydroxide Higilite® H42-M (Showa Denko K.K.), agitating the particles for 1 hour at room temperature, heating the particles, and effecting reaction at 100° C. for 1 hour.

The silicone rubber composition was press molded at 150° C. for 10 minutes into rubber sheets of 6 mm and 2 mm thick, which were tested for physical properties, tracking resistance, and erosion loss as in Example 1. The results are shown in Tables 1 and 2.

Comparative Example 8

Compound (n) was prepared by blending 100 parts of rubbery organopolysiloxane (f) consisting of 99.825 mol % of dimethylsiloxane units, 0.15 mol % of methylvinylsiloxane units, and 0.025 mol % of dimethylvinylsiloxy units and having an average degree of polymerization of about 8,000 with 5 parts of a silanol end-blocked dimethylpolysiloxane (average degree of polymerization 10) as a dispersant, 25 parts of fumed silica having a specific surface area of 200 m²/g (Nippon Aerosil K.K.), and 160 parts of aluminum hydroxide (m) having a vinyl content of $5.2 \times 10^{-7}$ mol/g, a carbon content of 0.35% by weight and a mean particle size of 1 μm.

Note that the aluminum hydroxide (m) was prepared by spraying 1.5 parts of divinyltetramethyldisilazane to 100 parts of untreated aluminum hydroxide Higilite® H42-M (Showa Denko K.K.), agitating the particles for 1 hour at room temperature, heating the particles, and effecting reaction at 100° C. for 1 hour.

To Compound (n) was added 1.0 part of a 40% paste of 2,5-dimethyl-bis(2,5-t-butylperoxy)hexane/the abovementioned organopolysiloxane (a)/fumed silica having a specific surface area of 200 m²/g (Nippon Aerosil K.K.). The ingredients were uniformly dispersed in a twin roll mill. The silicone rubber composition was then press molded at 170° C. for 10 minutes into rubber sheets of 6 mm and 2 mm thick, which were tested for physical properties, tracking resistance, and erosion loss as in Example 1. The results are shown in Tables 1 and 2.

Comparative Example 9

Compound (q) was prepared by blending 100 parts of rubbery organopolysiloxane (f) consisting of 99.825 mol % of dimethylsiloxane units, 0.15 mol % of methylvinylsiloxane units, and 0.025 mol % of dimethylvinylsiloxy units and having an average degree of polymerization of about 8,000 with 5 parts of a silanol end-blocked dimethylpolysiloxane (average degree of polymerization 10) as a dispersant, 25 parts of fumed silica having a specific surface area of 200 m²/g (Nippon Aerosil K.K.), and 160 parts of aluminum hydroxide (p) having a vinyl content of $8.8 \times 10^{-4}$ mol/g, a carbon content of 0.35% by weight and a mean particle size of 1 μm.

Note that the aluminum hydroxide (p) was prepared by spraying 4.6 parts of divinyltetramethyldisilazane to 100 parts of untreated aluminum hydroxide Higilite® H42-M (Showa Denko K.K.), agitating the particles for 1 hour at room temperature, heating the particles, and effecting reaction at 100° C. for 1 hour.

To Compound (q) was added 1.0 part of a 40% paste of 2,5-dimethyl-bis(2,5-t-butylperoxy)hexane/the abovementioned organopolysiloxane (a)/fumed silica having a specific surface area of 200 m²/g (Nippon Aerosil K.K.). The ingredients were uniformly dispersed in a twin roll mill. The silicone rubber composition was then press molded at 170° C. for 10 minutes into rubber sheets of 6 mm and 2 mm thick, which were tested for physical properties, tracking resistance, and erosion loss as in Example 1. The results are shown in Tables 1 and 2.

TABLE 1

| | Example | | | | | Comparative Example | | | | | | | | |
|---|---|---|---|---|---|---|---|---|---|---|---|---|---|---|
| | 1 | 2 | 3 | 4 | 5 | 1 | 2 | 3 | 4 | 5 | 6 | 7 | 8 | 9 |
| Hardness (JIS-A) | 62 | 66 | 58 | 70 | 72 | 54 | 60 | 52 | 36 | 65 | 55 | 82 | 62 | 80 |
| Tensile strength (kgf/cm$^2$) | 58 | 50 | 55 | 45 | 50 | 22 | 25 | 18 | 40 | 20 | 22 | 41 | 28 | 45 |
| Elongation (%) | 220 | 180 | 250 | 280 | 290 | 140 | 100 | 130 | 320 | 200 | 130 | 60 | 320 | 100 |

TABLE 2

| | Example | | | | | Comparative Example | | | | | | | | |
|---|---|---|---|---|---|---|---|---|---|---|---|---|---|---|
| | 1 | 2 | 3 | 4 | 5 | 1 | 2 | 3 | 4 | 5 | 6 | 7 | 8 | 9 |
| Tracking time (hr.) | 12.2 | 12.5 | 12.2 | 14.0 | 14.4 | 8.0 | 7.2 | 6.9 | 1.0 | 9.0 | 9.8 | 9.5 | 10.2 | 10.2 |
| Erosion weight (wt %) | 0.03 | 0.03 | 0.04 | 0.02 | 0.02 | 0.04 | 0.03 | 0.05 | 3.56 | 0.04 | 0.04 | 0.03 | 0.03 | 0.05 |

Japanese Patent Application No. 271999/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A silicone rubber composition for use as a high-voltage electrical insulator comprising
   (A) 100 parts by weight of an organopolysiloxane composition of the organic peroxide or addition reaction curing type, and
   (B) 30 to 400 parts by weight of aluminum hydroxide which has been surface treated so as to bear $1.0 \times 10^{-6}$ to $2.0 \times 10^{-4}$ mol/gram of vinyl groups.

2. The silicone rubber composition of claim 1 wherein said organopolysiloxane composition of the organic peroxide curing type comprises as main components,
   (a) 100 parts by weight of an organopolysiloxane having on the average at least two alkenyl groups in a molecule of the following average compositional formula (1):

$$R^1{}_a SiO_{(4-a)/2} \quad (1)$$

wherein $R^1$ is a substituted or unsubstituted monovalent hydrocarbon group, 0.01 to 10 mol % of the $R^1$ groups being alkenyl, at least 90 mol % of the $R^1$ groups being methyl, and letter a is a positive number of 1.9 to 2.4, and
   (b) a catalytic amount of an organic peroxide.

3. The silicone rubber composition of claim 1 wherein said organopolysiloxane composition of the addition reaction curing type comprises as main components,
   (a) 100 parts by weight of an organopolysiloxane having on the average at least two alkenyl groups in a molecule of the following average compositional formula (1):

$$R^1{}_a SiO_{(4-a)/2} \quad (1)$$

wherein $R^1$ is a substituted or unsubstituted monovalent hydrocarbon group, 0.01 to 10 mol % of the $R^1$ groups being alkenyl, at least 90 mol % of the $R^1$ groups being methyl, and letter a is a positive number of 1.9 to 2.4,
   (c) 0.1 to 200 parts by weight of an organohydrogenpolysiloxane of the following average compositional formula (2):

$$R^2{}_b H_c SiO_{(4-b-c)/2} \quad (2)$$

wherein $R^2$ is a substituted or unsubstituted monovalent hydrocarbon group having 1 to 10 carbon atoms, letter b is a positive number of 0.7 to 2.1, c is a positive number of 0.001 to 1.0, and the sum of b+c is from 0.8 to 3.0, said organohydrogenpolysiloxane having at least two hydrogen atoms each attached to a silicon atom in a molecule and being liquid at room temperature, and
   (d) a catalytic amount of an addition reaction catalyst.

4. The silicone rubber composition of claim 1 wherein component (B) is obtained by treating aluminum hydroxide with at least one agent selected from vinylsilazanes and vinylalkoxysilanes.

5. The silicone rubber composition of claim 1 wherein in component (B), aluminum hydroxide has been surface treated to such an extent that the amount of carbon attached thereto is 0.01 to 2% by weight of the aluminum hydroxide.

6. The silicone rubber composition of claim 1 wherein in component (B), aluminum hydroxide has a mean particle size in the range of 0.1 to 20 μm.

7. A polymeric bushing which has been prepared by applying the silicone rubber composition of claim 1 to an outer periphery of a plastic core, followed by curing.

8. The composition of claim 2, wherein $R^1$ in formula (1), is an alkyl, alkenyl, cyclohexenyl, phenyl, tolyl, xylyl, biphenyl, naphthyl, benzyl, phenylethyl, phenylpropyl or methylbenzyl group of 1 to 12 carbon atoms, each optionally substituted by halogen atoms or cyano groups.

9. The composition of claim 2, wherein in formula (1), 0.02 to 2.0 mol % of the $R^1$ groups are alkenyl.

10. The composition of claim 2, wherein in formula (1), a is a positive number in the range 1.98 to 2.05.

11. The composition of claim 3, wherein $R^1$ in formula (1) and $R^2$ in formula (2), are independently an alkyl, alkenyl, cyclohexenyl, phenyl, tolyl, xylyl, biphenyl, naphthyl, benzyl, phenylethyl, phenylpropyl or methylbenzyl group of 1 to 12 carbon atoms, each optionally substituted by halogen atoms or cyano groups.

12. The composition of claim 3, wherein in formula (1), 0.02 to 2.0 mol % of the $R^1$ groups are alkenyl and none of the $R^2$ groups are alkenyl.

13. The composition of claim 3, wherein in formula (1), a is a positive number in the range 1.98 to 2.05 and, in formula (2), b is a positive number in the range 0.9 to 2 and c is a positive number in the range 0.01 to 1.

14. The composition of claim 1, wherein the aluminum hydroxide has a mean particle size of 0.5 to 15 µm.

15. The composition of claim 1, wherein the aluminum hydroxide has a specific surface area of about 1.0 to 10 m²/g as measured by the BET method.

16. The composition of claim 1, wherein the aluminum hydroxide has been surface treated to bear $5.0 \times 10^{-6}$ to $1.0 \times 10^{-4}$ mol/gram of vinyl groups.

17. The composition of claim 1, wherein the aluminum hydroxide, (B), is provided in an amount of 50 to 300 parts by weight per 100 parts by weight of the organopolysiloxane composition, (A).

18. A polymeric bushing which comprises a silicone rubber composition of claim 1, in cured form, attached on the outer periphery of a plastic core.

19. A polymeric bushing which comprises a silicone rubber composition of claim 2, in cured form, attached on the outer periphery of a plastic core.

20. A polymeric bushing which comprises a silicone rubber composition of claim 3, in cured form, attached on the outer periphery of a plastic core.

* * * * *